(12) United States Patent
Liu

(10) Patent No.: US 11,355,735 B2
(45) Date of Patent: Jun. 7, 2022

(54) DISPLAY PANEL AND DISPLAY DEVICE WITH AN OPTICAL MODULATION LAYER

(71) Applicant: SHENZHEN CHINA STAR OPTOELECTRONICS SEMICONDUCTOR DISPLAY TECHNOLOGY CO., LTD., Shenzhen (CN)

(72) Inventor: Ming Liu, Shenzhen (CN)

(*) Notice: Subject to any disclaimer, the term of this patent is extended or adjusted under 35 U.S.C. 154(b) by 336 days.

(21) Appl. No.: 16/617,514

(22) PCT Filed: Nov. 6, 2019

(86) PCT No.: PCT/CN2019/115950
§ 371 (c)(1),
(2) Date: Nov. 27, 2019

(87) PCT Pub. No.: WO2021/051498
PCT Pub. Date: Mar. 25, 2021

(65) Prior Publication Data
US 2022/0006056 A1    Jan. 6, 2022

(30) Foreign Application Priority Data
Sep. 16, 2019 (CN) .......................... 201910872792.4

(51) Int. Cl.
*H01L 51/52* (2006.01)
(52) U.S. Cl.
CPC ................. *H01L 51/5271* (2013.01)
(58) Field of Classification Search
CPC .. H01L 51/5271; H01L 51/5275; H01L 33/46

USPC .................................................. 257/40, 98
See application file for complete search history.

(56) References Cited

U.S. PATENT DOCUMENTS

| | | | |
|---|---|---|---|
| 2006/0097631 A1 | 5/2006 | Lee | |
| 2010/0096617 A1* | 4/2010 | Shanks | H01L 51/5271 257/13 |
| 2012/0032211 A1 | 2/2012 | Schindler | |
| 2013/0215501 A1 | 8/2013 | Hisamitsu | |
| 2014/0061617 A1* | 3/2014 | So | H01L 51/5271 257/40 |
| 2015/0008419 A1 | 1/2015 | Li | |
| 2015/0188086 A1 | 7/2015 | Hou et al. | |
| 2016/0336530 A1 | 11/2016 | Zhang et al. | |
| 2019/0245010 A1* | 8/2019 | Benoit | H01L 51/5293 |

(Continued)

FOREIGN PATENT DOCUMENTS

| | | |
|---|---|---|
| CN | 1780017 A | 5/2006 |
| CN | 1816228 A | 8/2006 |

(Continued)

*Primary Examiner* — Ajay Arora

(57) ABSTRACT

An embodiment of the present invention discloses a display panel and a display device. The display panel includes a dual-sided light emitting device layer, an optical modulation layer, and a cover plate layer. The optical modulation layer is located between the dual-sided light emitting device layer and the cover plate layer. The optical modulation layer is configured to reflect light emitted from the dual-sided light emitting device layer toward the cover plate layer. The present invention disposes the optical modulation layer between the dual-sided light emitting device layer and the cover plate layer to prevent light waste.

12 Claims, 3 Drawing Sheets

(56) References Cited

U.S. PATENT DOCUMENTS

2019/0326546 A1    10/2019  Li et al.
2020/0203666 A1     6/2020  Yang et al.

FOREIGN PATENT DOCUMENTS

| | | |
|---|---|---|
| CN | 101809778 A | 8/2010 |
| CN | 103180764 A | 6/2013 |
| CN | 103715230 A | 4/2014 |
| CN | 103728683 A | 4/2014 |
| CN | 104272487 A | 1/2015 |
| CN | 104617228 A | 5/2015 |
| CN | 108417725 A | 8/2018 |
| CN | 108598279 A | 9/2018 |
| CN | 108666438 A | 10/2018 |
| CN | 108987604 A | 12/2018 |
| CN | 109192882 A | 1/2019 |
| CN | 109509844 A | 3/2019 |
| JP | 2002075659 A | 3/2002 |

\* cited by examiner

DISPLAY PANEL AND DISPLAY DEVICE WITH AN OPTICAL MODULATION LAYER

FIELD OF INVENTION

The present invention relates to a field of display technologies, especially relates to a display panel and a display device.

BACKGROUND OF INVENTION

At present, the development of display technology is changing with each passing day. The fast development display technologies provides unlimited possibilities for electronic terminals, especially display technologies of organic light emitting diodes (OLEDs). An OLED is light and thin and even has characteristics of manufacture of flexible products, and therefore has a prospect of an extremely wide application in fields of display technologies and illumination technologies. The OLED can be used for manufacture of translucent products with light transmissive and illuminating functions. However, an OLED device with a common design emits light on double sides, which has limitations for application. A part of light of the OLED device is not used and causes light waste. For example, when applied to a glass curtain wall of a building, the OLED device has a part of the light is emitted outward, which causes light waste.

In other words, the conventional display panel has an issue of light wasting.

SUMMARY OF INVENTION

Technical Issue

The conventional display panel has an issue of light wasting.

Technical Solution

An embodiment of the present invention provides a display panel that can prevent light from wasting.

To solve the above issue, the present invention provides a display panel, the display panel comprises a dual-sided light emitting device layer, an optical modulation layer, and a cover plate layer, the optical modulation layer is located between the dual-sided light emitting device layer and the cover plate layer, the optical modulation layer is configured to reflect light emitted from the dual-sided light emitting device layer toward the cover plate layer such that the light from the dual-sided light emitting device layer is emitted out of a surface of the display panel;

the optical modulation layer comprises at least two sub-optical modulation layers, a partition layer is disposed between adjacent two of the sub-optical modulation layers, and reflectance spectrums of the at least two sub-optical modulation layers are different;

the dual-sided light emitting device layer is a white light organic light emitting device layer, a reflectivity of the optical modulation layer to light with a wavelength less than 490 nm is lower than a reflectivity of the optical modulation layer to light with a wavelength from 490 nm to 670 nm.

Each of the sub-optical modulation layers comprises first refraction layers and second refraction layers stacked alternately on one another, in the same one of the sub-optical modulation layers, a refractive index of each of the first refraction layers is different from a refractive index of each of the second refraction layers.

To solve the above issue, the present invention provides a display panel, the display panel comprises a dual-sided light emitting device layer, an optical modulation layer, and a cover plate layer, the optical modulation layer is located between the dual-sided light emitting device layer and the cover plate layer, the optical modulation layer is configured to reflect light emitted from the dual-sided light emitting device layer toward the cover plate layer such that the light from the dual-sided light emitting device layer is emitted out of a surface of the display panel.

The optical modulation layer comprises at least two sub-optical modulation layers, a partition layer is disposed between adjacent two of the sub-optical modulation layers, and reflectance spectrums of the at least two sub-optical modulation layers are different.

Each of the sub-optical modulation layers comprises first refraction layers and second refraction layers stacked alternately on one another, in the same one of the sub-optical modulation layers, a refractive index of each of the first refraction layers is different from a refractive index of each of the second refraction layers.

In the same one of the sub-optical modulation layers, a thickness of each of the first refraction layers is different from a thickness of each of the second refraction layers.

Each of the sub-optical modulation layers comprises at least two the first refraction layers and at least two the second refraction layers.

The refractive index of each of the first refraction layers is less than 1.6, and the refractive index of each of the second refraction layers is greater than 2.

A material of the first refraction layers comprises at least one of magnesium fluoride, calcium fluoride, and silicon oxide, a material of the second refraction layers comprises at least one of tin zinc, zinc sulfide, and zirconium dioxide, a material of the partition layer comprises at least one of silicon oxide and silicon nitride.

The dual-sided light emitting device layer is a white light organic light emitting device layer, a reflectivity of the optical modulation layer to light with a wavelength less than 490 nm is lower than a reflectivity of the optical modulation layer to light with a wavelength from 490 nm to 670 nm.

The dual-sided light emitting device layer comprises an organic functional layer and a first electrode and a second electrode that are located on two sides of the organic functional layer respectively, the organic functional layer emits light through the first electrode and the second electrode dual-sided, the optical modulation layer and the cover plate layer are stacked sequentially on a side of the second electrode away from the organic functional layer, and a base is disposed on a side of the first electrode away from the organic functional layer.

To solve the above issue, the present invention provides a display device, the display device comprises a display panel, the display panel comprises a dual-sided light emitting device layer, an optical modulation layer, and a cover plate layer, the optical modulation layer is located between the dual-sided light emitting device layer and the cover plate layer, the optical modulation layer is configured to reflect light emitted from the dual-sided light emitting device layer toward the cover plate layer such that the light from the dual-sided light emitting device layer is emitted out of a surface of the display panel.

The optical modulation layer comprises at least two sub-optical modulation layers, a partition layer is disposed between adjacent two of the sub-optical modulation layers, and reflectance spectrums of the at least two sub-optical modulation layers are different.

Each of the sub-optical modulation layers comprises first refraction layers and second refraction layers stacked alternately on one another, in the same one of the sub-optical modulation layers, a refractive index of each of the first refraction layers is different from a refractive index of each of the second refraction layers.

In the same one of the sub-optical modulation layers, a thickness of each of the first refraction layers is different from a thickness of each of the second refraction layers.

Each of the sub-optical modulation layers comprises at least two the first refraction layers and at least two the second refraction layers.

The refractive index of each of the first refraction layers is less than 1.6, and the refractive index of each of the second refraction layers is greater than 2.

A material of the first refraction layers comprises at least one of magnesium fluoride, calcium fluoride, and silicon oxide, a material of the second refraction layers comprises at least one of tin zinc, zinc sulfide, and zirconium dioxide, a material of the partition layer comprises at least one of silicon oxide and silicon nitride.

The dual-sided light emitting device layer is a white light organic light emitting device layer, a reflectivity of the optical modulation layer to light with a wavelength less than 490 nm is lower than a reflectivity of the optical modulation layer to light with a wavelength from 490 nm to 670 nm.

The dual-sided light emitting device layer comprises an organic functional layer and a first electrode and a second electrode that are located on two sides of the organic functional layer respectively, the organic functional layer emits light through the first electrode and the second electrode dual-sided, the optical modulation layer and the cover plate layer are stacked sequentially on a side of the second electrode away from the organic functional layer, and a base is disposed on a side of the first electrode away from the organic functional layer.

Advantages

Advantages: an embodiment of the present invention provides a display panel, the display panel comprises a dual-sided light emitting device layer, an optical modulation layer, and a cover plate layer. The optical modulation layer is located between the dual-sided light emitting device layer and the cover plate layer, and the optical modulation layer is configured to reflect light emitted from the dual-sided light emitting device layer toward the cover plate layer. The present invention disposes the optical modulation layer between the dual-sided light emitting device layer and the cover plate layer. When emitting light, the dual-sided light emitting device dual-sided reflects a portion of light emitting toward the cover plate layer through the optical modulation layer such that the light emitted from the dual-sided light emitting device is concentrated on a surface of the display panel and is emitted out, which prevents light waste.

DESCRIPTION OF DRAWINGS

To more clearly elaborate on the technical solutions of embodiments of the present invention or prior art, appended figures necessary for describing the embodiments of the present invention or prior art will be briefly introduced as follows. Apparently, the following appended figures are merely some embodiments of the present invention. A person of ordinary skill in the art may acquire other figures according to the appended figures without any creative effort.

DETAILED DESCRIPTION OF PREFERRED EMBODIMENTS

Figure 1:
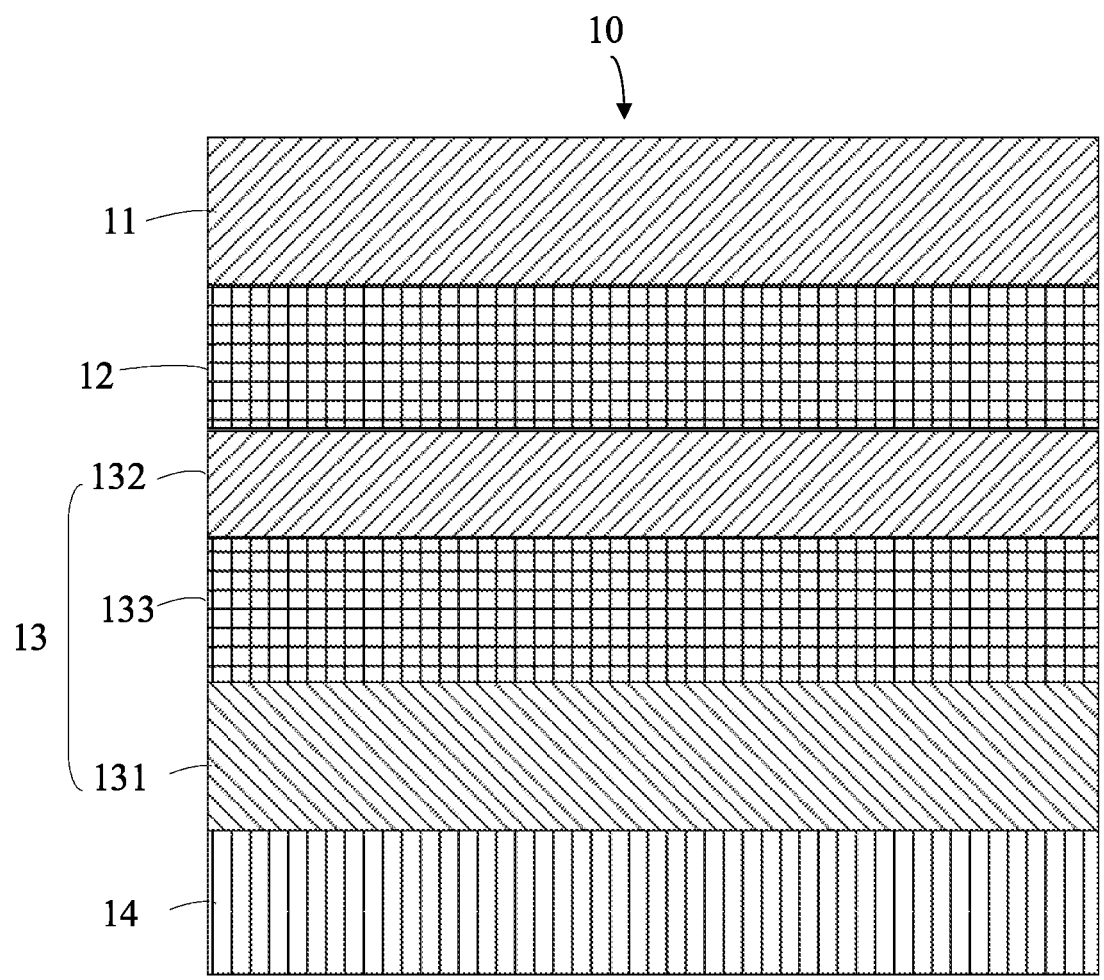
FIG. 1 is a schematic structural view of an embodiment of a display panel of the present invention.

The technical solution in the embodiment of the present invention will be clearly and completely described below with reference to the accompanying drawings in the embodiments of the present invention. Apparently, the described embodiments are merely some embodiments of the present invention instead of all embodiments. According to the embodiments in the present invention, all other embodiments obtained by those skilled in the art without making any creative effort shall fall within the protection scope of the present invention.

In the description of the present invention, it should be understood that terminologies "center", "longitudinal", "transverse", "length", "width", "thickness", "upper", "lower", "front", "rear", "left", "side", "vertical", "horizontal", "top", "bottom", "inner", "outer", "clockwise", "counterclockwise" for indicating relations of orientation or position are based on orientation or position of the accompanying drawings, are only for the purposes of facilitating description of the present invention and simplifying the description instead of indicating or implying that the referred device or element must have a specific orientation or position, must to be structured and operated with the specific orientation or position. Therefore, they should not be understood as limitations to the present invention. Furthermore, terminologies "first", "second" are only for the purposes of description, and cannot be understood as indication or implication of comparative importance or a number of technical features. Therefore, a feature limited with "first", "second" can expressly or implicitly include one or more features. In the description of the present invention, a meaning of "a plurality of" is two or more, unless there is a clear and specific limitation otherwise.

In the present invention, the word "exemplary" is used to mean "serving as an example, illustration or description". Any embodiment described as "exemplary" in the present invention is not necessarily construed as preferred or more advantageous over other embodiments. In order to enable any person skilled in the art to implement and use the present invention, the following description is given. In the following description, details are set forth for the purpose of explanation. It should be understood that a person of ordinary skill in the art will appreciate that the present invention may be implemented without the use of these specific details. In other instances, the known structures and processes are not elaborated to avoid unnecessary details from making descriptions of the present invention becomes ambiguous. Therefore, the present invention is not intended to be limited to the illustrated embodiment, but is consistent with the broadest scope of the principles and features disclosed by the present invention.

An embodiment of the present invention provides a display panel, and the display panel comprises a dual-sided light emitting device layer, an optical modulation layer, and a cover plate layer. The optical modulation layer is located between the dual-sided light emitting device layer and the cover plate layer. The optical modulation layer is configured to reflect light emitted from the dual-sided light emitting device layer toward the cover plate layer such that the light from the dual-sided light emitting device layer is emitted out of a surface of the display panel. The display panel of the embodiment of the present invention can be applied to a variety of display devices, which will be described as follows.

Figure 2:
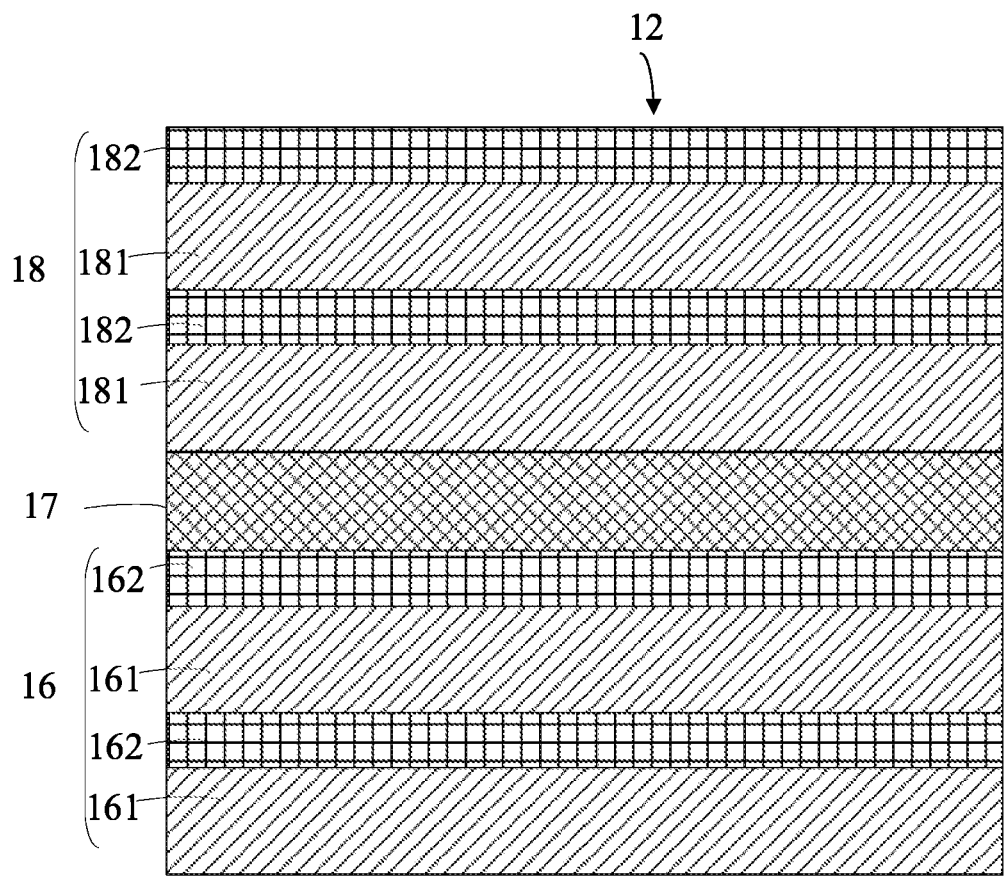
FIG. 2 is a schematic structural view of an embodiment of an optical modulation layer of the display panel in FIG. 1.
Figure 3:
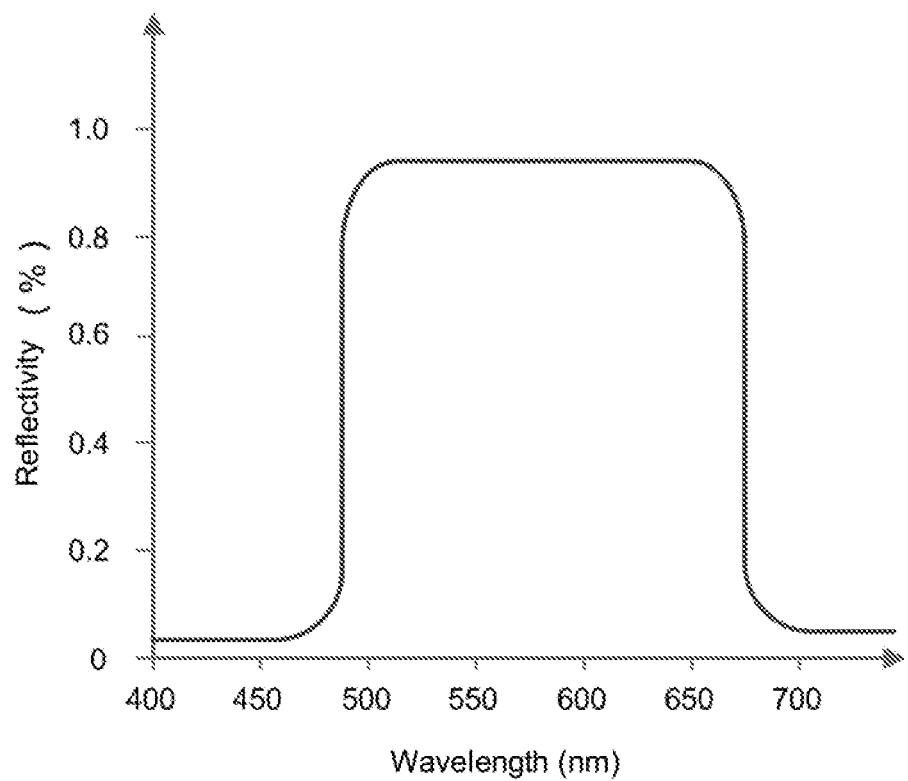
FIG. 3 is a schematic structural view of an embodiment of a reflectance spectrum of an optical modulation layer of the display panel in FIG. 1.

With reference to FIGS. 1 to 3, FIG. 1 is a schematic structural view of an embodiment of a display panel of the present invention provides; FIG. 2 is a schematic structural view of an embodiment of an optical modulation layer of the display panel in FIG. 1; and FIG. 3 is a schematic structural view of an embodiment of a reflectance spectrum of an optical modulation layer of the display panel in FIG. 1.

With reference to FIGS. 1 to 3, in an embodiment of the present invention, the display panel 10 comprises a dual-sided light emitting device layer 13, an optical modulation layer 12, and a cover plate layer 11. The optical modulation layer 12 is located between the dual-sided light emitting device layer 13 and the cover plate layer 11. The optical modulation layer 12 is configured to reflect light emitted from the dual-sided light emitting device layer 13 toward the cover plate layer 11, such that the light from the dual-sided light emitting device layer 13 is emitted out of a surface of the display panel 10.

Furthermore, the dual-sided light emitting device layer 13 comprises an organic functional layer 133 and a first electrode 131 and a second electrode 132 that are located on two sides of the organic functional layer 133 respectively. The organic functional layer 133 through the first electrode 131 and the second electrode 132 emits light out from two sides. The optical modulation layer 12 and the cover plate layer 11 are stacked sequentially on a side of the second electrode 132 away from the organic functional layer 133. A base 14 is disposed on a side of the first electrode 131 away from the organic functional layer 133. Preferably, a material of the first electrode 131 is indium tin oxide, and a material of the second electrode 132 is indium tin oxide or magnesium silver alloy. The first electrode 131 and the second electrode 132 are both transparent electrodes. The cover plate layer 11 is a transparent cover plate, and is configured to protect the organic functional layer 133.

Preferably, the base 14 is a flexible substrate. A material of the base 14 can be polyimide (PI), and can be polyethylene terephthalate (PET), and the present invention has no limitation thereto.

Furthermore, the optical modulation layer 12 comprises at least two sub-optical modulation layers, and a partition layer is disposed between adjacent two of the sub-optical modulation layers. Reflectance spectrums of the at least two sub-optical modulation layers are different. Reflectance spectrum of the at least two sub-optical modulation layers are different. by at least two stacked sub-optical modulation layers, a spectral width of the reflectance spectrum of the optical modulation layer 12 is increased. For example, the optical modulation layer 12 comprises sub-optical modulation layers of a number n, and the n is is an integrity not less than 1. A spectral width of each of the sub-optical modulation layers is 10 nm. Then, the optical modulation layer 12 has a spectral width of 10n nm. When the spectral width of the sub-optical modulation layers is increased to 20 nm, to obtain an optical modulation layer 12 having the spectral width of 10n nm, only the sub-optical modulation layers of a number n/2 are needed. Therefore, a number of the sub-optical modulation layers can be specifically set by a width of a spectrum of the sub-optical modulation layers, and the present invention has no limitation thereto.

In a specific embodiment, as shown in FIG. 2, the optical modulation layer 12 comprises two sub-optical modulation layers that are a first sub-optical modulation layer 16 and a second sub-optical modulation layer 18. A partition layer 17 is disposed between the first sub-optical modulation layer 16 and the second sub-optical modulation layer 18. Specifically, a material of the partition layer 17 comprises at least one of silicon oxide and silicon nitride. A thickness δ of the partition layer 17 fulfills a equation: $\delta=(2\pi/\lambda 1)*d$, wherein the δ is an optical phase thickness, the λ1 is a reflection peak of the first sub-optical modulation layer 16, and the d is a thickness of the partition layer 17.

Furthermore, each of the sub-optical modulation layers comprises first refraction layers and second refraction layers stacked alternately on one another, in the same one of the sub-optical modulation layers, a refractive index of each of the first refraction layers is different from a refractive index of each of the second refraction layers. Specifically, a refractive index of the first refraction layer is less than 1.6, and a refractive index of the second refraction layer is greater than 2. A material of the first refraction layer comprises at least one of magnesium fluoride, calcium fluoride, and silicon oxide, and a material of the second refraction layer comprises at least one of tin zinc, zinc sulfide, and zirconium dioxide.

Furthermore, in the same one of the sub-optical modulation layers, a thickness of each of the first refraction layers is different from a thickness of each of the second refraction layers. A corresponding reflection peak wavelength $\lambda=2(n1 \times dA + n2 \times dB)$, wherein the n1 is a refractive index of the first refraction layer, the n2 is a refractive index of the second refraction layers, the dA is a thickness of a first refraction layer, and the dB is a thickness of the second refraction layer. By using a combination of two alternately disposed refraction layers with different refractive indexes, the optical modulation layer 12 with a wider spectral width is acquired such that light of wavelengths of an extensive range is reflected. Simultaneously, By using a combination of two alternately disposed refraction layers with different thickness, the optical modulation layer 12 with a wider spectral width is acquired such that light of wavelengths of an extensive range is reflected.

Furthermore, each of the sub-optical modulation layers comprises at least two first refraction layers and at least two second refraction layers. For example, each of the sub-optical modulation layers comprises first refraction layers of a number x and second refraction layers of a number x, the x is an positive integrity not less than 2. Depending on a specific value of the x, a spectral width of the sub-optical modulation layer varies. By adjusting numbers of the first refraction layers and the second refraction layers, the spectral width of the sub-optical modulation layers can be adjusted to further adjust the number of the sub-optical modulation layers and to adjust the reflectance spectrum of the optical modulation layer 12. Preferably, in the same one of the sub-optical modulation layers, the first refraction layers have the same thickness, and the second refraction layers have the same thickness.

In a specific embodiment, the first sub-optical modulation layer 16 comprises two first refraction layers and two second refraction layers, and the second sub-optical modulation layer 18 comprises two first refraction layers and two second refraction layers. As shown in FIG. 2, in the first sub-optical modulation layer 16, the two first refraction layers are two third refraction layers 161, and the two second refraction layers are two fourth refraction layers 162. The two third refraction layers 161 and the two fourth refraction layers 162 are distributed alternately. A refractive index and a thickness of the third refraction layer 161 are different from a refractive index and a thickness of the fourth refraction layer 162.

In the second sub-optical modulation layer 18, the two first refraction layers are two fifth refraction layers 181, and the two second refraction layers are two sixth refraction layers 182. The two fifth refraction layers 181 and the two sixth refraction layers 182 are distributed alternately. A refractive index and a thickness of the fifth refraction layer are different from a refractive index and a thickness of the sixth refraction layers 182.

A thickness of the fifth refraction layer 181 is different from a thickness of the third refraction layer 161. A thickness of the fourth refraction layer 162 is also different from a thickness of the sixth refraction layer 182. In other words, the thicknesses of the first refraction layers in different sub-optical modulation layers are different, and the thicknesses of the second refraction layers in different sub-optical modulation layers are different.

Furthermore, the optical modulation layer 12 can be manufactured by a vacuum vapor deposition process, a magnetron sputtering process, a chemical deposition process, or an atomic layer deposition process.

Furthermore, with reference to FIG. 3, FIG. 3 is a schematic structural view of an embodiment of a reflectance spectrum of an optical modulation layer of the display panel in FIG. 1. With reference to FIGS. 1 to 3, the dual-sided light emitting device layer 13 is a white light organic light emitting device layer, a reflectivity of the optical modulation layer 12 to light with a wavelength less than 490 nm is lower than a reflectivity of the optical modulation layer 12 to light with a wavelength from 490 nm to 670 nm. Preferably, the optical modulation layer 12 transmits the light with the wavelength less than 490 nm, and reflects the light with the wavelength from 490 nm to 670 nm. When external white light emits from the cover plate layer 11 into the display panel 10, light in a range of green, yellow, and red is reflected by the optical modulation layer 12 and only blue light passes through the optical modulation layer 12 and enters the display panel 10. The display panel 10 has a semi-light-shielding effect and a privacy protection function. When the dual-sided light emitting device layer 13 emits light out from two sides, a part of the emitted light is emitted directly toward the base 14, another part of the light is emitted toward a side of the cover plate layer 11. However, in light emitted toward the cover plate layer 11, the light in the range of green, yellow, and red is reflected by the optical modulation layer 12 and emitted toward the base 14. Only blue light can be emitted out from cover plate layer 11 and the base 14 bidirectionally. Therefore, most of photons are finally emitted out from a side of the base 14 and form white light for use.

In other embodiments, the reflectance spectrum of the optical modulation layer 12 can be adjusted as needed, and the present invention has no limitations thereto.

Compared to the prior art, an embodiment of the present invention provides a display panel, the display panel comprises a dual-sided light emitting device layer, an optical modulation layer, and a cover plate layer. The optical modulation layer is located between the dual-sided light emitting device layer and the cover plate layer, and the optical modulation layer is configured to reflect light emitted from the dual-sided light emitting device layer toward the cover plate layer. The present invention disposes the optical modulation layer between the dual-sided light emitting device layer and the cover plate layer. When emitting light, the dual-sided light emitting device dual-sided reflects a portion of light emitting toward the cover plate layer through the optical modulation layer such that the light emitted from the dual-sided light emitting device is concentrated on a surface of the display panel and is emitted out, which prevents light waste.

It should be explained that in the embodiments of the above display panel only structures are described. It can be understood that, besides the above structures, the display panel of an embodiment of the present invention can further comprises other necessary structures as needed, and no limitation is thereto.

In the specific implementation, each of the above units or structures may be implemented as a separate entity, or may be any combination, and implemented as the same entity or a plurality of entities. The specific implementation of the above units or structures refer to the previous method embodiment and will not be described repeatedly.

Specific implementation of each operation can refer to the above embodiments and will not be described repeatedly herein.

The display panel and the display device of the embodiments of the present invention are introduced in details as described above. In the specification, the specific examples are used to explain the principle and embodiment of the present invention. The above description of the embodiments is only used to help understand the method of the present invention and its spiritual idea. Meanwhile, for those skilled in the art, according to the present the idea of invention, changes will be made in specific embodiment and application. In summary, the contents of this specification should not be construed as limiting the present invention.

What is claimed is:

1. A display panel, wherein the display panel comprises a dual-sided light emitting device layer, an optical modulation layer, and a cover plate layer, the optical modulation layer is located between the dual-sided light emitting device layer and the cover plate layer, the optical modulation layer is configured to reflect light emitted from the dual-sided light emitting device layer toward the cover plate layer such that the light from the dual-sided light emitting device layer is emitted out of a surface of the display panel;

wherein the optical modulation layer comprises two sub-optical modulation layers, a partition layer is disposed between the sub-optical modulation layers, and reflectance spectrums of the sub-optical modulation layers are different;

wherein each of the sub-optical modulation layers comprises first refraction layers and second refraction layers of equal numbers stacked alternately on one another, in the same one of the sub-optical modulation layers, a refractive index of each of the first refraction layers is different from a refractive index of each of the second refraction layers;

wherein a thickness of each of the first refraction layers of one of the sub-optical modulation layers is different from a thickness of each of the first refraction layers of the other of the sub-optical modulation layers, and a thickness of each of the second refraction layers of one of the sub-optical modulation layers is different from a thickness of each of the second refraction layers of the other of the sub-optical modulation layers; and wherein one of two opposite surfaces of the partition layer is adjacent to one of the first refraction layers of one of the sub-optical modulation layers, and the other of the two opposite surfaces of the partition layer is adjacent to one of the second refraction layers of the other of the sub-optical modulation layers.

2. The display panel as claimed in claim 1, wherein in the same one of the sub-optical modulation layers, a thickness of each of the first refraction layers is different from a thickness of each of the second refraction layers.

3. The display panel as claimed in claim 1, wherein the refractive index of each of the first refraction layers is less than 1.6, and the refractive index of each of the second refraction layers is greater than 2.

4. The display panel as claimed in claim 3, wherein a material of the first refraction layers comprises at least one of magnesium fluoride, calcium fluoride, and silicon oxide, a material of the second refraction layers comprises at least one of tin zinc, zinc sulfide, and zirconium dioxide, a material of the partition layer comprises at least one of silicon oxide and silicon nitride.

5. The display panel as claimed in claim 1, wherein the dual-sided light emitting device layer is a white light organic light emitting device layer, a reflectivity of the optical modulation layer to light with a wavelength less than 490 nm is lower than a reflectivity of the optical modulation layer to light with a wavelength from 490 nm to 670 nm.

6. The display panel as claimed in claim 1, wherein the dual-sided light emitting device layer comprises an organic functional layer and a first electrode and a second electrode that are located on two sides of the organic functional layer respectively, the organic functional layer emits light through the first electrode and the second electrode dual-sided, the optical modulation layer and the cover plate layer are stacked sequentially on a side of the second electrode away from the organic functional layer, and a base is disposed on a side of the first electrode away from the organic functional layer.

7. A display device, wherein the display device comprises a display panel, the display panel comprises a dual-sided light emitting device layer, an optical modulation layer, and a cover plate layer, the optical modulation layer is located between the dual-sided light emitting device layer and the cover plate layer, the optical modulation layer is configured to reflect light emitted from the dual-sided light emitting device layer toward the cover plate layer such that the light from the dual-sided light emitting device layer is emitted out of a surface of the display panel;

wherein the optical modulation layer comprises two sub-optical modulation layers, a partition layer is disposed between the sub-optical modulation layers, and reflectance spectrums of the sub-optical modulation layers are different;

wherein each of the sub-optical modulation layers comprises first refraction layers and second refraction layers of equal numbers stacked alternately on one another, in the same one of the sub-optical modulation layers, a refractive index of each of the first refraction layers is different from a refractive index of each of the second refraction layers;

wherein a thickness of each of the first refraction layers of one of the sub-optical modulation layers is different from a thickness of each of the first refraction layers of the other of the sub-optical modulation layers, and a thickness of each of the second refraction layers of one of the sub-optical modulation layers is different from a thickness of each of the second refraction layers of the other of the sub-optical modulation layers; and wherein one of two opposite surfaces of the partition layer is adjacent to one of the first refraction layers of one of the sub-optical modulation layers, and the other of the two opposite surfaces of the partition layer is adjacent to one of the second refraction layers of the other of the sub-optical modulation layers.

8. The display device as claimed in claim 7, wherein in the same one of the sub-optical modulation layers, a thickness of each of the first refraction layers is different from a thickness of each of the second refraction layers.

9. The display device as claimed in claim 7, wherein the refractive index of each of the first refraction layers is less than 1.6, and the refractive index of each of the second refraction layers is greater than 2.

10. The display device as claimed in claim 9, wherein a material of the first refraction layers comprises at least one of magnesium fluoride, calcium fluoride, and silicon oxide, a material of the second refraction layers comprises at least one of tin zinc, zinc sulfide, and zirconium dioxide, a material of the partition layer comprises at least one of silicon oxide and silicon nitride.

11. The display device as claimed in claim 7, wherein the dual-sided light emitting device layer is a white light organic light emitting device layer, a reflectivity of the optical modulation layer to light with a wavelength less than 490 nm is lower than a reflectivity of the optical modulation layer to light with a wavelength from 490 nm to 670 nm.

12. The display device as claimed in claim 7, wherein the dual-sided light emitting device layer comprises an organic functional layer and a first electrode and a second electrode that are located on two sides of the organic functional layer respectively, the organic functional layer emits light through the first electrode and the second electrode dual-sided, the optical modulation layer and the cover plate layer are stacked sequentially on a side of the second electrode away from the organic functional layer, and a base is disposed on a side of the first electrode away from the organic functional layer.

* * * * *